United States Patent
Yoshikawa (10) Patent No.: US 11,606,861 B2
(45) Date of Patent: Mar. 14, 2023

(54) PRINTED WIRING BOARD

(71) Applicant: IBIDEN CO., LTD., Gifu (JP)

(72) Inventor: Kyohei Yoshikawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/578,671

(22) Filed: Jan. 19, 2022

(65) Prior Publication Data

US 2022/0240380 A1 Jul. 28, 2022

(30) Foreign Application Priority Data

Jan. 22, 2021 (JP) .............................. JP2021-008628

(51) Int. Cl.
*H05K 1/02* (2006.01)
*H05K 1/11* (2006.01)

(52) U.S. Cl.
CPC ........... *H05K 1/0298* (2013.01); *H05K 1/111* (2013.01); *H05K 1/0287* (2013.01); *H05K 2201/094* (2013.01); *H05K 2201/09727* (2013.01); *H05K 2201/09818* (2013.01)

(58) Field of Classification Search
CPC ....... H05K 1/0298; H05K 2201/09818; H05K 3/28; H05K 3/108; H05K 2201/098; H05K 2203/0307; H05K 3/243; H05K 1/118; H05K 3/241; H05K 3/361; H05K 2203/0723; H05K 1/0393; H05K 2203/1476; H05K 2201/09736; H05K 2201/09727; H05K 1/0287; H05K 1/111; H05K 2201/09372; H05K 2201/094; H05K 2201/09409; H05K 1/11
See application file for complete search history.

(56) References Cited

U.S. PATENT DOCUMENTS

| | | | | |
|---|---|---|---|---|
| 7,495,177 | B2 * | 2/2009 | Kataoka | H05K 3/26 174/257 |
| 2002/0022385 | A1 * | 2/2002 | Miyake | H05K 3/363 439/67 |
| 2004/0036833 | A1 * | 2/2004 | Monzen | H05K 3/361 349/158 |
| 2013/0049202 | A1 * | 2/2013 | Tani | H05K 1/0242 174/257 |

(Continued)

FOREIGN PATENT DOCUMENTS

JP 2000-022334 A 1/2000

*Primary Examiner* — Steven T Sawyer
(74) *Attorney, Agent, or Firm* — Oblon, McClelland, Maier & Neustadt, L.L.P.

(57) ABSTRACT

A printed wiring board includes a first resin insulating layer, a conductor layer on the first resin insulating layer, and a second resin insulating layer formed on the first resin insulating layer such that the second resin insulating layer is covering the conductor layer. The conductor layer includes a first circuit having a width of 15 μm or less and a rectangular cross-sectional shape, a second circuit having a trapezoidal cross-sectional shape, a third circuit, a fourth circuit, a fifth circuit, and a sixth circuit, a space between the first and third circuits has a width of 14 μm or less, a space between the first and fourth circuits has a width of 14 μm or less, a space between the second and fifth circuits has a width of 20 μm or more, and a space between the second and sixth circuits has a width of 20 μm or more.

20 Claims, 3 Drawing Sheets

(56) References Cited

U.S. PATENT DOCUMENTS

| | | | |
|---|---|---|---|
| 2013/0269992 A1* | 10/2013 | Doi | H01B 3/008 174/250 |
| 2016/0066423 A1* | 3/2016 | Sakamoto | H01L 23/49822 29/846 |
| 2021/0219424 A1* | 7/2021 | Nitta | H05K 1/0298 |

* cited by examiner

PRINTED WIRING BOARD

CROSS-REFERENCE TO RELATED APPLICATIONS

The present application is based upon and claims the benefit of priority to Japanese Patent Application No. 2021-008628, filed Jan. 22, 2021, the entire contents of which are incorporated herein by reference.

BACKGROUND OF THE INVENTION

Field of the Invention

The present invention relates to a printed wiring board having a resin insulating layer and a conductor layer.

Description of Background Art

Japanese Patent Application Laid-Open Publication No. 2000-22334 describes a printed wiring board having conductor circuits and a resin insulating layer. The entire contents of this publication are incorporated herein by reference.

SUMMARY OF THE INVENTION

According to one aspect of the present invention, a printed wiring board includes a first resin insulating layer, a conductor layer formed on a surface of the first resin insulating layer, and a second resin insulating layer formed on the surface of the first resin insulating layer such that the second resin insulating layer is covering the conductor layer. The conductor layer includes a first conductor circuit having a first width of 15 μm or less and a substantially rectangular cross-sectional shape, a second conductor circuit having a second width and a substantially trapezoidal cross-sectional shape, a third conductor circuit positioned on a first side of the first conductor circuit, a fourth conductor circuit positioned on a second side of the first conductor circuit on the opposite side with respect to the first side, a fifth conductor circuit positioned on a first side of the second conductor circuit, and a sixth conductor circuit positioned on a second side of the second conductor circuit on the opposite side with respect to the first side of the second conductor circuit, the first and third conductor circuits are positioned to have a third space formed between the first and third conductor circuits such that the third space has a third width of 14 μm or less, the first and fourth conductor circuits are positioned to have a fourth space formed between the first and fourth conductor circuits such that the fourth space has a fourth width of 14 μm or less, the second and fifth conductor circuits are positioned to have a fifth space formed between the second and fifth conductor circuits such that the fifth space has a fifth width of 20 μm or more, and the second and sixth conductor circuits are positioned to have a sixth space formed between the second and sixth conductor circuits such that the sixth space has a sixth width of 20 μm or more.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Embodiments will now be described with reference to the accompanying drawings, wherein like reference numerals designate corresponding or identical elements throughout the various drawings.

Figure 3A:
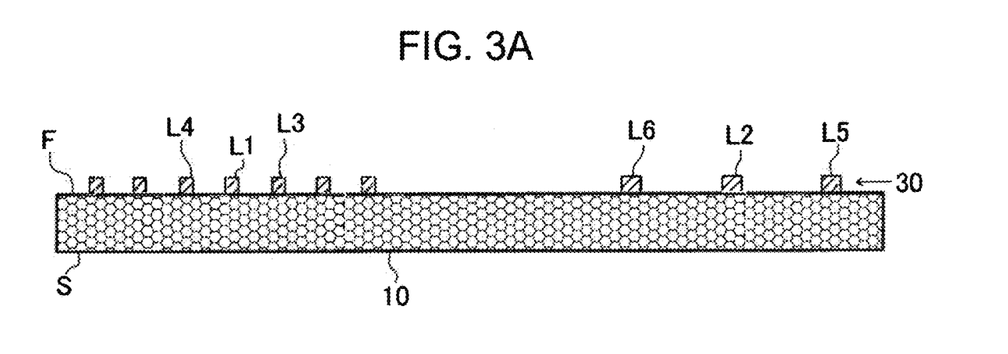
FIGS. 3A-3D are manufacturing process diagrams of a printed wiring board according to an embodiment of the present invention.
Figure 3B:
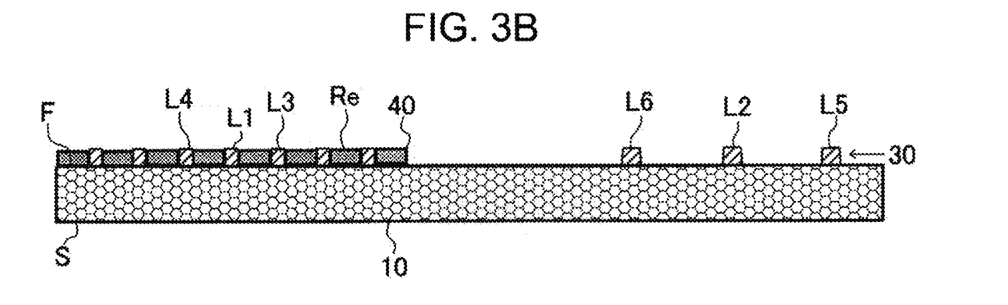
Figure 3C:
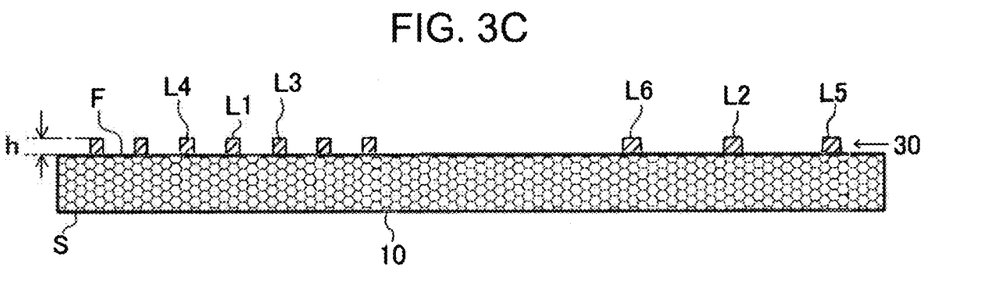
Figure 3D:
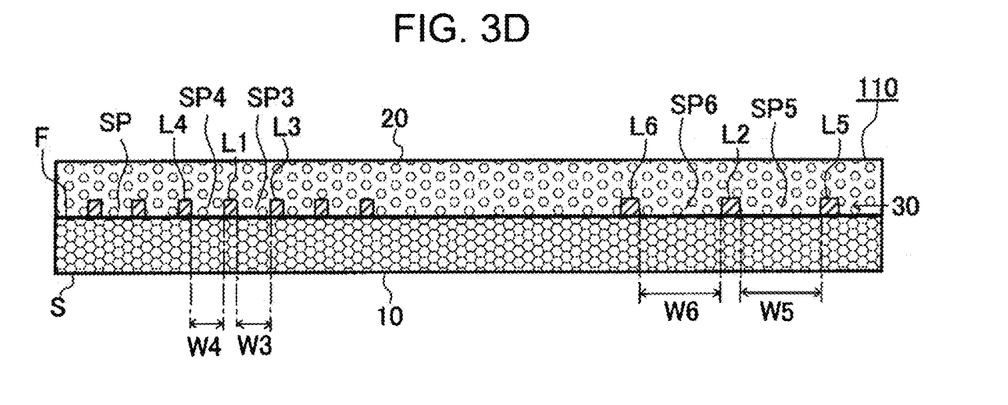

FIG. 3D illustrates a cross section of a printed wiring board 110 of an embodiment.

Figure 1A:
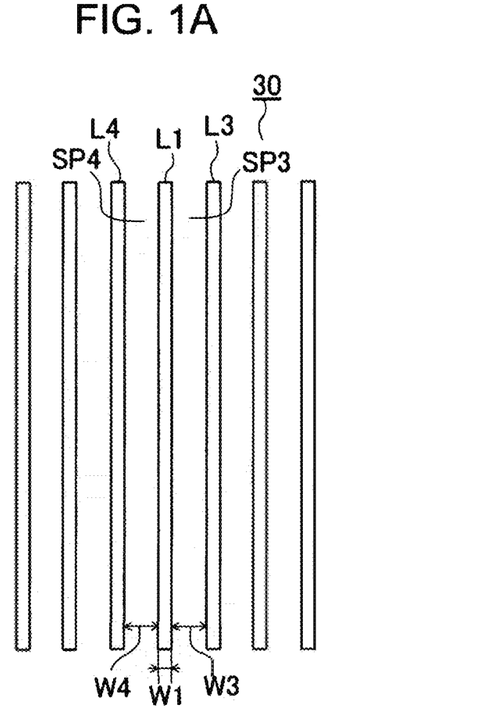
FIGS. 1A and 1B are plan views of a conductor layer of a printed wiring board according to an embodiment of the present invention.
Figure 1B:
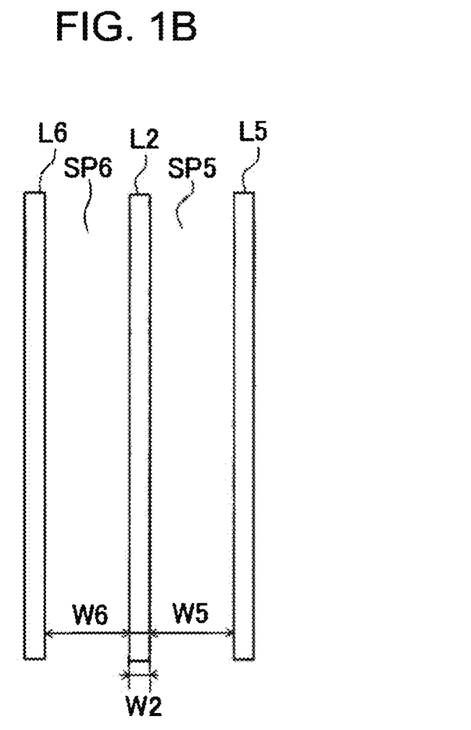
Figure 1C:
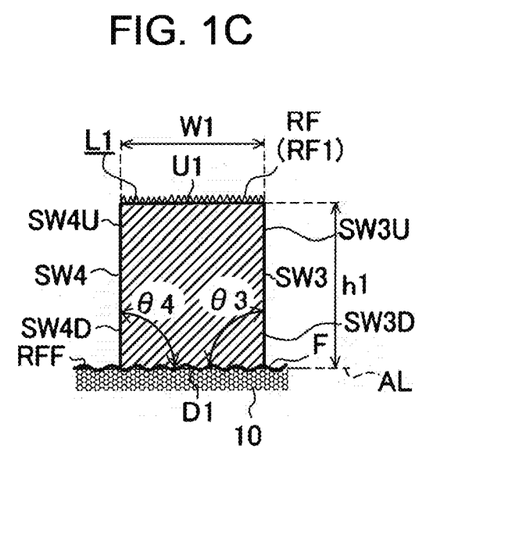
FIG. 1C is a cross-sectional view of a first conductor circuit.
Figure 1D:
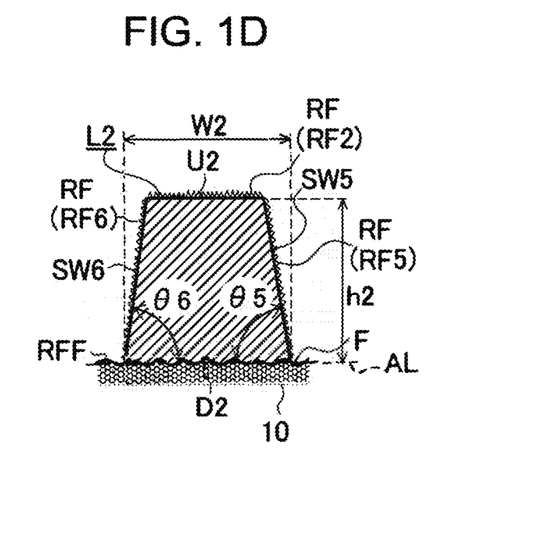
FIG. 1D is a cross-sectional view of a second conductor circuit.

The printed wiring board 110 includes a first resin insulating layer 10 having a first surface (F) and a second surface (S) on the opposite side with respect to the first surface (F), a conductor layer 30 formed on the first surface (F) of the first resin insulating layer 10, and a second resin insulating layer 20 formed on the first surface (F) of the first resin insulating layer 10 and on the conductor layer 30. The second resin insulating layer 20 fills spaces (SP) between conductor circuits forming the conductor layer 30. FIGS. 1A and 1B are plan views illustrating an upper surface of the conductor layer 30. As illustrated in FIGS. 1C and 1D, the first surface (F) of the first resin insulating layer 10 has a first unevenness (RFF). When the first surface (F) has the first unevenness (RFF), the first surface (F) includes an average line (AL) of a roughness curve of the first unevenness (RFF). The average line (AL) is illustrated in FIGS. 1C and 1D.

As illustrated in FIG. 1A, the conductor layer 30 includes a first conductor circuit (L1) and conductor circuits (a third conductor circuit (L3) and a fourth conductor circuit (L4)) positioned on both sides of the first conductor circuit (L1). The third conductor circuit (L3) is positioned to the right of the first conductor circuit (L1), and the fourth conductor circuit (L4) is positioned to the left of the first conductor circuit (L1).

As illustrated in FIG. 1B, the conductor layer 30 includes a second conductor circuit (L2) and conductor circuits (a fifth conductor circuit (L5) and a sixth conductor circuit (L6)) positioned on both sides of the second conductor circuit (L2). The fifth conductor circuit (L5) is positioned to the right of the second conductor circuit (L2), and the sixth conductor circuit (L6) is positioned to the left of the second conductor circuit (L2).

Figure 2A:
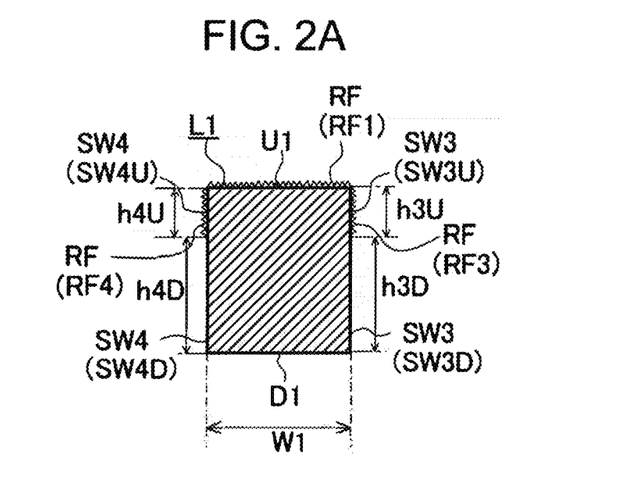
FIG. 2A is a cross-sectional view of a first conductor circuit of a second example.

FIGS. 1C and 2A each illustrate a cross section of the first conductor circuit (L1). The first conductor circuit (L1) illustrated in FIG. 1C is a first example. The first conductor circuit (L1) illustrated in FIG. 2A is a second example.

The first conductor circuit (L1) has a first lower surface (D1) in contact with the first surface (F) of the first resin insulating layer 10, a first upper surface (U1) on the opposite side with respect to the first lower surface (D1), a third side wall (SW3) facing the third conductor circuit (L3), and a fourth side wall (SW4) facing the fourth conductor circuit (L4). As illustrated in FIGS. 1C and 2A, the third side wall (SW3) of the first conductor circuit (L1) has an upper side third side wall (SW3U) extending from the first upper surface (U1) and a lower side third side wall (SW3D) extending from the first lower surface (D1). The fourth side wall (SW4) has an upper side fourth side wall (SW4U) extending from the first upper surface (U1) and a lower side fourth side wall (SW4D) extending from the first lower surface (D1). The first conductor circuit (L1) has a substantially rectangular cross-sectional shape. The first conductor circuit (L1) has a first width (W1). There is a third angle (θ3) between the third side wall (SW3) and the first lower surface (D1), and there is a fourth angle (θ4) between the fourth side wall (SW4) and the first lower surface (D1). The third angle (θ3) and the fourth angle (θ4) are determined from a plane containing a cross section of the first conductor circuit (L1). The cross section of the first conductor circuit (L1) is obtained by cutting the printed wiring board 110 in a plane perpendicular to the first surface (F).

FIG. 1D illustrates a cross section of the second conductor circuit (L2).

The second conductor circuit (L2) has a second lower surface (D2) in contact with the first surface (F) of the first resin insulating layer 10, a second upper surface (U2) on the opposite side with respect to the second lower surface (D2), a fifth side wall (SW5) facing the fifth conductor circuit (L5), and a sixth side wall (SW6) facing the sixth conductor circuit (L6). The second conductor circuit (L2) has a substantially trapezoidal cross-sectional shape. The second conductor circuit (L2) has a second width (W2). There is a fifth angle (θ5) between the fifth side wall (SW5) and the second lower surface (D2), and there is a sixth angle (θ6) between the sixth side wall (SW6) and the second lower surface (D2). The fifth angle (θ5) and the sixth angle (θ6) are determined from a plane containing a cross section of the second conductor circuit (L2). The cross section of the second conductor circuit (L2) is obtained by cutting the printed wiring board 110 in a plane perpendicular to the first surface (F).

As illustrated in FIG. 1C, the third angle (θ3) exists between a straight line containing the third side wall (SW3) and the average line (AL) of the first surface (F), and the fourth angle (θ4) exists between a straight line containing the fourth side wall (SW4) and the average line (AL) of the first surface (F). As illustrated in FIG. 1D, the fifth angle (θ5) exists between a straight line containing the fifth side wall (SW5) and the average line (AL) of the first surface (F), and the sixth angle (θ6) exists between a straight line containing the sixth side wall (SW6) and the average line (AL) of the first surface (F).

The third angle (θ3) and the fourth angle (θ4) are larger than the fifth angle (θ5). The third angle (θ3) and the fourth angle (θ4) are larger than the sixth angle (θ6). A difference between the third angle (θ3) and the fifth angle (θ5) is 7 degrees or more, and a difference between the third angle (θ3) and the sixth angle (θ6) is 7 degrees or more. A difference between the fourth angle (θ4) and the fifth angle (θ5) is 7 degrees or more, and a difference between the fourth angle (θ4) and the sixth angle (θ6) is 7 degrees or more. The third angle (θ3) and the fourth angle (θ4) are substantially equal to each other. The fifth angle (θ5) and the sixth angle (θ6) are substantially equal to each other.

As illustrated in FIGS. 1A and 3D, there is a third space (SP3) between the first conductor circuit (L1) and the third conductor circuit (L3). There is a fourth space (SP4) between the first conductor circuit (L1) and the fourth conductor circuit (L4). The third space (SP3) has a third width (W3) and the fourth space (SP4) has a fourth width (W4). As illustrated in FIGS. 1B and 3D, there is a fifth space (SP5) between the second conductor circuit (L2) and the fifth conductor circuit (L5). There is a sixth space (SP6) between the second conductor circuit (L2) and the sixth conductor circuit (L6). The fifth space (SP5) has a fifth width (W5), and the sixth space (SP6) has a sixth width (W6).

The first width (W1) of the first conductor circuit (L1), the second width (W2) of the second conductor circuit (L2), the third width (W3) of the third space (SP3), the fourth width (W4) of the fourth space (SP4), the fifth width (W5) of the fifth space (SP5), and the sixth width (W6) of the sixth space (SP6) are measured on the first surface (F) of the first resin insulating layer 10. The first width (W1), the second width (W2), the third width (W3), the fourth width (W4), the fifth width (W5), and the sixth width (W6) are determined from a plane containing a cross section of the first conductor circuit (L1). For example, the first width (W1) of the first conductor circuit (L1) and the second width (W2) of the second conductor circuit (L2) are each 15 μm or less. The third width (W3) of the third space (SP3) and the fourth width (W4) of the fourth space (SP4) are each 5 μm or more and 14 μm or less. The fifth width (W5) of the fifth space (SP5) and the sixth width (W6) of the sixth space (SP6) are each 20 μm or more.

When the first surface (F) has the first unevenness (RFF), the first width (W1), the second width (W2), the third width (W3), the fourth width (W4), the fifth width (W5), and the sixth width (W6) are measured on the average line (AL) of the first surface (F).

As illustrated in FIGS. 1C and 2A, the first upper surface (U1) of the first conductor circuit (L1) has a rough surface (unevenness) (RF). In the example (first example) of FIG. 1C, the first upper surface (U1) has a rough surface (RF), and the third side wall (SW3) and the fourth side wall (SW4) have no rough surface (RF). In the example (second example) of FIG. 2A, the first upper surface (U1), the upper side third side wall (SW3U) and the upper side fourth side wall (SW4U) each have a rough surface (RF), and the lower side third side wall (SW3D) and lower side fourth side wall (SW4D) have no rough surface (RF).

A length (h3U) of the upper side third side wall (SW3U) is shorter than a length (h3D) of the lower side third side wall (SW3D). A length (h4U) of the upper side fourth side wall (SW4U) is shorter than a length (h4D) of the lower side fourth side wall (SW4D). A ratio ((the length (h3D))/(the length (h3U))) of the length (h3D) of the lower side third side wall (SW3D) to the length (h3U) of the upper side third side wall (SW3U) is 1.5 or more and 2 or less. A ratio ((the length (h4D))/(the length (h4U))) of the length (h4D) of the lower side fourth side wall (SW4D) to the length (h4U) of the upper side fourth side wall (SW4U) is 1.5 or more and 2 or less.

As illustrated in FIG. 1D, the second upper surface (U2), the fifth side wall (SW5) and the sixth side wall (SW6) of the second conductor circuit (L2) each have a rough surface (unevenness) (RF).

As illustrated in FIG. 3D, the second resin insulating layer 20 fills the spaces (SP3, SP4, SP5, SP6). For example, the second resin insulating layer 20 enters the third space (SP3) by pressing. The third space (SP3) is filled with the second resin insulating layer 20. The second resin insulating layer 20 enters the fourth space (SP4) by pressing. The fourth space (SP4) is filled with the second resin insulating layer 20. The second resin insulating layer 20 enters the fifth space (SP5) by pressing. The fifth space (SP5) is filled with the second resin insulating layer 20. The second resin insulating layer 20 enters the fifth space (SP5) by pressing. The sixth space (SP6) is filled with the second resin insulating layer 20.

The narrower a space (SP) between conductor circuits is, the more difficult it is to fill the space (SP) with the second resin insulating layer 20. And, a rough surface (RF) on a side wall of a conductor circuit impedes the filling of the space (SP) with the second resin insulating layer 20.

In the printed wiring board 110 of the embodiment, the third width (W3) and the fourth width (W4) are each 14 μm or less. The third width (W3) and the fourth width (W4) are each preferably 5 μm or more. The third width (W3) and the fourth width (W4) are small. It is difficult to fill the third space (SP3) and the fourth space (SP4) with the second resin insulating layer 20. However, as illustrated in FIGS. 1C and 2A, the first conductor circuit (L1) has a substantially rectangular cross-sectional shape. Therefore, the second resin insulating layer 20 substantially directly enters the third space (SP3). The second resin insulating layer 20 substantially directly enters the fourth space (SP4). Even at a low pressure, the third space (SP3) and the fourth space (SP4) can be filled with the second resin insulating layer 20. Since the pressure is low, when the spaces (SP3, SP4) are filled with the second resin insulating layer 20, the first conductor circuit (L1) is unlikely to collapse. Even when the third width (W3) and the fourth width (W4) are small, the third space (SP3) and the fourth space (SP4) are filled with the second resin insulating layer 20. Insulation resistance between the first conductor circuit (L1) and the third conductor circuit (L3) can be increased. Insulation resistance between the first conductor circuit (L1) and the fourth conductor circuit (L4) can be increased.

The entire side walls of the first conductor circuit (L1) have no rough surface. In the example of FIG. 1C, no rough surface (RF) is formed on the entire side walls. In the example of FIG. 2A, no rough surface (RF) is formed on a part of each of the side walls. Therefore, even when the widths (W3, W4) of the spaces (SP3, SP4) are small, the second resin insulating layer 20 easily enters the third space (SP3). The second resin insulating layer 20 easily enters the fourth space (SP4). The third space (SP3) can be filled with the second resin insulating layer 20. The fourth space (SP4) can be filled with the second resin insulating layer 20.

When a width of a space (SP) is 10 μm or more and 14 μm or less, it is difficult to fill the space with the second resin insulating layer 20. Therefore, when a width of a space (SP) is 10 μm or more and 14 μm or less, the second example illustrated in FIG. 2A can be adopted. When the third width (W3) is 10 μm or more and 14 μm or less, the upper side third side wall (SW3U) has a rough surface (RF) and the lower side third side wall (SW3D) has no rough surface (RF). When the fourth width (W4) is 10 μm or more and 14 μm or less, the upper side fourth side wall (SW4U) has a rough surface (RF) and the lower side fourth side wall (SW4D) has no rough surface (RF).

When a width of a space (SP) is less than 10 it is more difficult to fill the space (SP) with the second resin insulating layer 20. Therefore, when a width of a space (SP) is less than 10 the first example illustrated in FIG. 1C can be adopted. When the third width (W3) is less than 10 the entire third side wall (SW3) has no rough surface (RF). When the fourth width (W4) is less than 10 the entire fourth side wall (SW4) has no rough surface (RF).

In the first example, the entire side walls of the first conductor circuit (L1) have no rough surface. Therefore, when the second resin insulating layer 20 enters the spaces (SP3, SP4), the second resin insulating layer 20 can smoothly slide on the side walls (SW3, SW4) of the first conductor circuit (L1). When the second resin insulating layer 20 enters the spaces (SP3, SP4), the second resin insulating layer 20 does not strongly press the first conductor circuit (L1). When the second resin insulating layer 20 enters the spaces (SP3, SP4), the first conductor circuit (L1) is unlikely to collapse.

The third width (W3) is 10 μm or more and 14 μm or less. Further, the fourth width (W4) is less than 10 In this case, the third side wall (SW3) is formed as in the second example illustrated in FIG. 2A. And, the fourth side wall (SW4) is formed as in the first example illustrated in FIG. 1C.

The smaller is a space (SP) between conductor circuits, the smaller is an amount of a resin that fills the space (SP). Even when the printed wiring board 110 is subjected to heat cycles, when a space (SP) between conductor circuits is small, an expansion amount and a contraction amount of a resin in the space (SP) are small. When a width of a space (SP) is 14 μm or less, even when a part of a side wall of a conductor circuit has no rough surface (RF), the resin insulating layer is unlikely to peel off from the conductor circuit. Even when an entire side wall of a conductor circuit has no rough surface (RF), the resin insulating layer is unlikely to peel off from the conductor circuit.

When the first conductor circuit (L1) has a rectangular cross-sectional shape, a contact area between the second resin insulating layer 20 and the side walls (SW3, SW4) of the first conductor circuit (L1) is small. When the printed wiring board 110 is subjected to heat cycles, the second resin insulating layer 20 is likely to peel off from the side walls (SW3, SW4). However, when the spaces (SP3, SP4) each have a width of 14 μm or less, even when the first conductor circuit (L1) has a substantially rectangular cross-sectional shape and no rough surface (RF) is formed on the entire side walls (SW3, SW4), the second resin insulating layer 20 is unlikely to peel off from the side walls (SW3, SW4).

A signal can be transmitted via the first conductor circuit (L1). The side walls of the first conductor circuit (L1) have no rough surface (RF). Or, a part of each of the side walls has no rough surface (RF). The first conductor circuit (L1) has a substantially rectangular cross-sectional shape. Therefore, a resistance of the first conductor circuit (L1) can be reduced. Even when the first width (W1) is 15 μm or less, a transmission loss can be reduced. The first conductor circuit (L1) can transmit a high-speed signal.

When a space (SP) between conductor circuits is large, an amount of a resin filling the space (SP) is large. In this case, when the printed wiring board 110 is subjected to heat cycles, an expansion amount and a contraction amount of the resin in the space (SP) are large. When the width of the space (SP) is 20 μm or more, it is thought that a force pressing the conductor circuit is strong. It is thought that a force pulling the conductor circuit is strong. When the width of the space (SP) is 20 μm or more, the resin insulating layer is likely to peel off from the side walls of the conductor circuit. When the width of the space (SP) is 20 μm or more and the width of the conductor circuit is 15 μm or less, the conductor circuit is likely to collapse due to the force caused by the heat cycles.

Figure 2B:
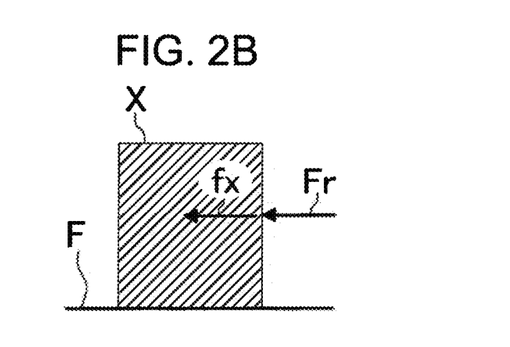
FIGS. 2B and 2C are prediction diagrams of forces pressing the conductor circuits.
Figure 2C:
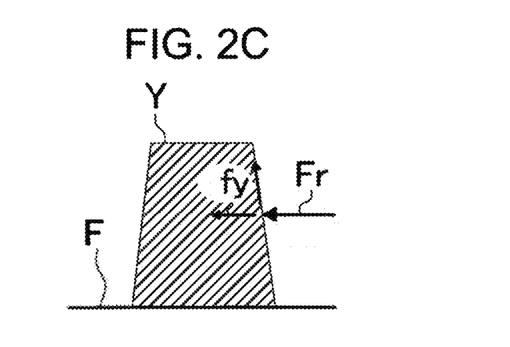

Examples of forces pressing sidewalls of conductor circuits (X, Y) are illustrated in FIGS. 2B and 2C. The examples illustrated in FIGS. 2B and 2C are predictions. The conductor circuit (X) illustrated in FIG. 2B has a rectangular cross-sectional shape. The conductor circuit (Y) illustrated in FIG. 2C has a trapezoidal cross-sectional shape. As illustrated in FIGS. 2B and 2C, it is thought that a force (first force) (Fr) parallel to the first surface (F) acts on a side wall of each of the conductor circuits (X, Y). When the cross-sectional shape of the conductor circuit is rectangular, as illustrated in FIG. 2B, a magnitude of a force (fx) transmitted to the conductor circuit (X) is considered to be equal to a magnitude of the first force (Fr). On the other hand, when the cross-sectional shape of the conductor circuit is trapezoidal, as illustrated in FIG. 2C, it is expected that the first force (Fr) is distributed along the sidewall of the conductor circuit (Y). Therefore, in FIG. 2C, it is considered that a magnitude of a force (fy) transmitted to the conductor circuit (Y) is smaller than the magnitude of the first force (Fr).

The widths (W5, W6) of the spaces (SP5, SP6) sandwiching the second conductor circuit (L2) are each 20 µm or more. The widths (W5, W6) are large. Therefore, an amount of the second resin insulating layer 20 filling the fifth space (SP5) and the sixth space (SP6) is large. When the printed wiring board 110 is subjected to heat cycles, an expansion amount and a contraction amount of the second resin insulating layer 20 in the spaces (SP5, SP6) are large. A force pressing the second conductor circuit (L2) is large. A force pulling the second conductor circuit (L2) is large. However, the second conductor circuit (L2) has a substantially trapezoidal cross-sectional shape. Therefore, as illustrated in FIG. 2C, the force transmitted to the second conductor circuit (L2) is reduced. Even when the fifth width (W5) and the sixth width (W6) are each 20 µm or more and the second width is 15 µm or less, the second conductor circuit (L2) is unlikely to collapse.

The fifth width (W5) and the sixth width (W6) are each 20 µm or more. Therefore, the second resin insulating layer 20 is likely to peel off from the second conductor circuit (L2). To prevent this problem, the second conductor circuit (L2) has rough surfaces (RF) on the upper surface (second upper surface) (U2) and the side walls (SW5, SW6). The entire second upper surface (U2) has the rough surface (RF). The entire fifth side wall (SW5) has the rough surface (RF). The entire sixth side wall (SW6) has the rough surface (RF). When the side walls (SW5, SW6) of the second conductor circuit (L2) have the rough surfaces (RF), adhesive strength between the side walls (SW5, SW6) of the second conductor circuit (L2) and the second resin insulating layer 20 is strong. Therefore, it is considered that a stress due to the expansion and contraction of the second resin insulating layer 20 in the spaces (SP5, SP6) strongly acts on the second conductor circuit (L2). When the width (second width) (W2) of the second conductor circuit (L2) is 15 µm or less, the second conductor circuit (L2) is likely to collapse. However, since the cross-sectional shape of the second conductor circuit (L2) is trapezoidal, the second conductor circuit (L2) is unlikely to collapse.

The side walls (SW5, SW6) of the second conductor circuit (L2) are inclined. Therefore, even when the side walls (SW5, SW6) have the rough surfaces (RF), the spaces (SP5, SP6) can be filled with the second resin insulating layer 20.

A size of unevenness (RF5) of the fifth side wall (SW5) is smaller than a size of unevenness (RF2) of the second upper surface (U2). A size of unevenness (RF6) of the sixth side wall (SW6) is smaller than the size of the unevenness (RF2) of the second upper surface (U2). The size of the unevenness (RF5) of the fifth side wall (SW5) and the size of the unevenness (RF6) of the sixth side wall (SW6) are substantially equal to each other. A size of unevenness (RF1) of the first upper surface (U1) and the size of the unevenness (RF2) of the second upper surface (U2) are substantially equal to each other. A size of unevenness (RF3) of the upper side third side wall (SW3U) and a size of unevenness (RF4) of the upper side fourth side wall (SW4U) are substantially equal to each other. The size of the unevenness (RF3) of the upper side third side wall (SW3U) and the size of the unevenness (RF4) of the upper side fourth side wall (SW4U) are smaller than the size of the unevenness (RF1) of the first upper surface (U1). The size of the unevenness (RF3) of the upper side third side wall (SW3U) and the size of the unevenness (RF5) of the fifth side wall (SW5) are substantially equal to each other. When the rough surfaces (RF) are formed on the side walls of the conductor circuits, the size of each of the rough surfaces (RF) on the side walls (SW3, SW4, SW5, SW6) gradually decreases from the upper surface (the first upper surface or the second upper surface) toward the lower surface (the first lower surface or the second lower surface). The size of the rough surface (RF) on the upper side third side wall (SW3U) and the size of the rough surface (RF) on the upper side fourth side wall (SW4U) gradually decrease from the upper surface (the first upper surface) to the lower surface (the first lower surface).

In the embodiment, a size of a rough surface (RF) is represented by an arithmetic mean roughness (Ra). In the embodiment, when the sizes (arithmetic mean roughnesses (Ra)) of the rough surfaces (RF) of the upper surfaces (U1, U2) are each 0.5 µm or more and 1.0 µm or less, it is determined that the upper surfaces (U1, U2) have the rough surfaces (RF). When the sizes (arithmetic mean roughnesses (Ra)) of the rough surfaces (RF) of the side walls (SW3, SW4, SW5, SW6) are each 0.5 µm or more and 1.0 µm or less, it is determined that the side walls (SW3, SW4, SW5, SW6) have the rough surfaces (RF). When the sizes (arithmetic mean roughnesses (Ra)) of the rough surfaces (RF) of the upper side side walls (SW3U, SW4U) are each 0.5 µm or more and 1.0 µm or less, it is determined that the upper side side walls (SW3U, SW4U) have the rough surfaces (RF). When the sizes (arithmetic mean roughnesses (Ra)) of the rough surfaces (RF) of the lower side side walls (SW3D, SW4D) are each 0.5 µm or more and 1.0 µm or less, it is determined that the lower side side walls (SW3D, SW4D) have the rough surfaces (RF).

When the sizes (arithmetic mean roughnesses (Ra)) of the rough surfaces (RF) of the upper surfaces (U1, U2) are each 0.01 µm or more and 0.2 µm or less, it is determined that the upper surfaces (U1, U2) have no rough surface (RF). When the sizes (arithmetic mean roughnesses (Ra)) of the rough surfaces (RF) of the side walls (SW3, SW4, SW5, SW6) are each 0.01 µm or more and 0.2 µm or less, it is determined that the side walls (SW3, SW4, SW5, SW6) have no rough surface (RF). When the sizes (arithmetic mean roughnesses (Ra)) of the rough surfaces (RF) of the upper side side walls (SW3U, SW4U) are each 0.01 µm or more and 0.2 µm or less, it is determined that the upper side side walls (SW3U, SW4U) have no rough surface (RF). When the sizes (arithmetic mean roughnesses (Ra)) of the rough surfaces (RF) of the lower side side walls (SW3D, SW4D) are each 0.01 µm or more and 0.2 µm or less, it is determined that the lower side side walls (SW3D, SW4D) have no rough surface (RF).

The size of the unevenness (RF1) of the first upper surface (U1) and the size of the unevenness (RF2) of the second upper surface (U2) are each 0.5 µm or more and 1.0 µm or less.

In the example (first example) of FIG. 1C, the size (arithmetic mean roughness (Ra)) of the unevenness (RF3) of the third side wall (SW3) is 0.01 µm or more and 0.2 µm or less. The size (arithmetic mean roughness (Ra)) of the unevenness (RF4) of the fourth side wall (SW4) is 0.01 μm or more and 0.2 μm or less.

In the example (second example) of FIG. 2A, the size (arithmetic mean roughness (Ra)) of the unevenness (RF3) of the upper side third side wall (SW3U) is 0.5 μm or more and 1.0 μm or less. The size (arithmetic mean roughness (Ra)) of the unevenness (RF4) of the upper side fourth side wall (SW4U) is 0.5 μm or more and 1.0 μm or less. The size (arithmetic mean roughness (Ra)) of the rough surface (RF) of the lower side third side wall (SW3D) is 0.01 μm or more and 0.2 μm or less. The size (arithmetic mean roughness (Ra)) of the rough surface (RF) of the lower side fourth side wall (SW4D) is 0.01 μm or more and 0.2 μm or less.

The first width (W1) and the second width (W2) are substantially equal to each other. Or, the second width (W2) is desirably larger than the first width (W1). For example, the first width (W1) is 7.5 μm or more and 15 μm or less. The second width (W2) may be 50 μm or more and 150 μm or less. A thickness (h1) of the first conductor circuit (L1) and a thickness (h2) of the second conductor circuit (L2) are each 7.5 μm or more and 15 μm or less. The conductor layer 30 has a thickness of 7 μm or more and 15 μm or less.

FIGS. 3A-3D illustrate manufacturing processes of a printed wiring board 110 according to an embodiment of the present invention.

Figure 2D:
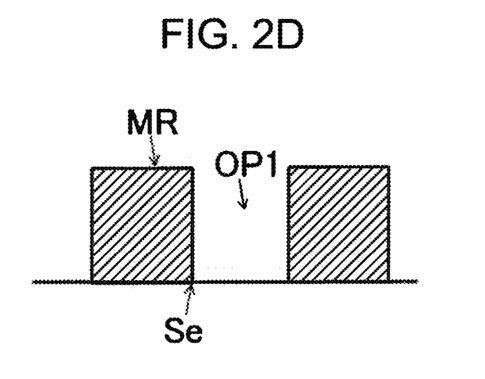
FIG. 2D illustrates a cross-sectional shape of a first opening.
Figure 2E:
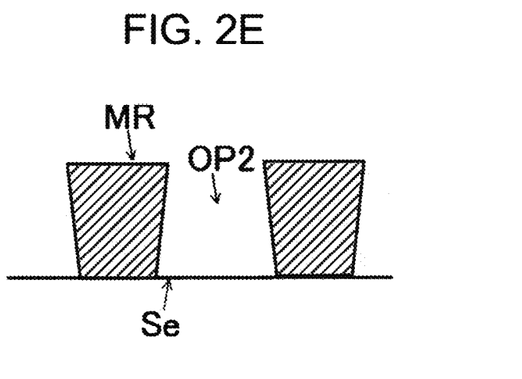
FIG. 2E illustrates a cross-sectional shape of a second opening.

A seed layer (Se) is formed on the first resin insulating layer 10. A resist for forming a plating resist is formed on the seed layer (Se). The resist is of a negative type. An exposure (first exposure) for forming a plating resist for the first conductor circuit (L1) and an exposure (second exposure) for forming a plating resist for the second conductor circuit (L2) are separately performed. An exposure amount (second exposure amount) of the second exposure is smaller than an exposure amount (first exposure amount) of the first exposure. The first exposure amount is appropriate. By development, a plating resist (MR) having a first opening (Op1) for the first conductor circuit (L1) and a second opening (Op2) for the second conductor circuit (L2) is formed on the seed layer (Se). A cross-sectional shape of the first opening (Op1) is illustrated in FIG. 2D. Since the first exposure amount is appropriate, the cross-sectional shape of the first opening (Op1) is rectangular. A cross-sectional shape of the second opening (Op2) is illustrated in FIG. 2E. The second exposure amount is less than an appropriate amount. Not enough light reaches the seed layer (Se). Therefore, the cross-sectional shape of the second opening (Op2) is trapezoidal. An electrolytic plating film is formed on the seed layer exposed from the openings (Op1, Op2) of the plating resist (MR). The electrolytic plating film is formed in the openings (Op1, Op2). The plating resist (MR) is removed. The seed layer (Se) exposed from the electrolytic plating film is removed. The conductor layer 30 is formed (FIG. 3A). The conductor layer 30 includes the first conductor circuit (L1), the second conductor circuit (L2), the third conductor circuit (L3), the fourth conductor circuit (L4), the fifth conductor circuit (L5), and the sixth conductor circuit (L6). The first conductor circuit (L1) has a rectangular cross-sectional shape. The second conductor circuit (L2) has a trapezoidal cross-sectional shape. A resist (Re) is formed on the first resin insulating layer 10 and the conductor layer 30. The upper surface (second upper surface) (U2) and the side walls (SW5, SW6) of the second conductor circuit (L2) are exposed by using a photographic technology. An upper surface and side walls of the fifth conductor circuit (L5) are exposed. An upper surface and side walls of the sixth conductor circuit (L6) are exposed. The upper surface (first upper surface) (U1) and the side walls (SW3, SW4) of the first conductor circuit (L1) are covered by the resist (Re). An upper surface and side walls of the third conductor circuit (L3) are covered by the resist (Re). An upper surface and side walls of the fourth conductor circuit (L4) are covered by the resist (Re). After that, the resist (Re) is polished such that the upper surface (first upper surface) (U1) of the first conductor circuit (L1), the upper surface of the third conductor circuit (L3), and the upper surface of the fourth conductor circuit (L4) are exposed (FIG. 3B). After that, the intermediate substrate illustrated in FIG. 3B is immersed in a chemical solution for forming rough surfaces (RF). As a result, the rough surface (RF1) is formed on the first upper surface (U1) of the first conductor circuit (L1). The rough surfaces (RF2, RF5, RF6) are respectively formed on the second upper surface (U2) and the side walls (SW5, SW6) of the second conductor circuit (L2). The side walls (SW3, SW4) of the first conductor circuit (L1) are covered by the resist (Re). Therefore, no rough surface is formed on the side walls (SW3, SW4) of the first conductor circuit (L1). Then, the resist (Re) is removed (FIG. 3C). The second resin insulating layer 20 is formed on the first resin insulating layer 10 and the conductor layer 30. The printed wiring board 110 is completed (FIG. 3D).

The intermediate substrate illustrated in FIG. 3B can be irradiated with plasma. Plasma is irradiated from above the upper surface (first upper surface) (U1) of the first conductor circuit (L1). As a result, the upper side third side wall (SW3U) and the upper side fourth side wall (SW4U) are exposed. The lower side third side wall (SW3D) and the lower side fourth side wall (SW4D) are covered by the resist (Re). After that, the rough surface (RF) is formed on the surfaces exposed to the outside. The rough surface (RF1) is formed on the first upper surface (U1) of the first conductor circuit (L1). The rough surfaces (RF3, RF4) are respectively formed on the upper side third side wall (SW3U) and the upper side fourth side wall (SW4U). The rough surfaces (RF2, RF5, RF6) are respectively formed on the second upper surface (U2) and the side walls (SW5, SW6) of the second conductor circuit (L2). The lower side third side wall (SW3D) and the lower side fourth side wall (SW4D) are covered by the resist (Re). Therefore, no rough surface (RF) is formed on the lower side third side wall (SW3D) and the lower side fourth side wall (SW4D). Then, the resist (Re) is removed. The printed wiring board 110 having the first conductor circuit (L1) illustrated in FIG. 2A is manufactured.

As illustrated in FIG. 6 of Japanese Patent Application Laid-Open Publication No. 2000-22334, a roughened layer is formed on entire surfaces of the conductor circuits in Japanese Patent Application Laid-Open Publication No. 2000-22334.

In Japanese Patent Application Laid-Open Publication No. 2000-22334, a space between conductor circuits is filled with an interlayer resin insulating layer. FIG. 6 of Japanese Patent Application Laid-Open Publication No. 2000-22334 illustrates a cross-sectional shape of a conductor circuit. According to FIG. 6 of Japanese Patent Application Laid-Open Publication No. 2000-22334, the cross-sectional shape of the conductor circuit of Japanese Patent Application Laid-Open Publication No. 2000-22334 appears to be rectangular. When the printed wiring board is subjected to heat cycles, the interlayer resin insulating layer (resin insulating layer) that fills the space repeats expansion and contraction. It is thought that, due to expansion, the conductor circuit is pressed. It is thought that due to contraction, the conductor circuit is pulled. Then, when the conductor circuit has a small width, it is predicted that the conductor circuit collapses due to an effect of expansion and contraction.

A printed wiring board according to an embodiment of the present invention includes: a first resin insulating layer having a first surface and a second surface on the opposite side with respect to the first surface; a conductor layer formed on the first surface; and a second resin insulating layer formed on the first surface and the conductor layer. The conductor layer includes a first conductor circuit, conductor circuits (a third conductor circuit and a fourth conductor circuit) positioned on both sides of the first conductor circuit, a second conductor circuit, and conductor circuits (a fifth conductor circuit and a sixth conductor circuit) positioned on both sides of the second conductor circuit. The third conductor circuit is positioned to the right of the first conductor circuit. The fourth conductor circuit is positioned to the left of the first conductor circuit. The fifth conductor circuit is positioned to the right of the second conductor circuit. The sixth conductor circuit is positioned to the left of the second conductor circuit. The first conductor circuit has a first lower surface in contact with the first surface, a first upper surface on the opposite side with respect to the first lower surface, a third side wall facing the third conductor circuit, and a fourth side wall facing the fourth conductor circuit. The third side wall is formed of an upper side third side wall extending from the first upper surface and a lower side third side wall extending from the first lower surface. The fourth side wall is formed of an upper side fourth side wall extending from the first upper surface and a lower side fourth side wall extending from the first lower surface. The second conductor circuit has a second lower surface in contact with the first surface, a second upper surface on the opposite side with respect to the second lower surface, a fifth side wall facing the fifth conductor circuit, and a sixth side wall facing the sixth conductor circuit. The first conductor circuit has a first width. The second conductor circuit has a second width. There is a third space between the first conductor circuit and the third conductor circuit. There is a fourth space between the first conductor circuit and the fourth conductor circuit. There is a fifth space between the second conductor circuit and the fifth conductor circuit. There is a sixth space between the second conductor circuit and the sixth conductor circuit. The third space has a third width. The fourth space has a fourth width. The fifth space has a fifth width. The sixth space has a sixth width. The first width, the second width, the third width, the fourth width, the fifth width, and the sixth width are measured on the first surface. The first width is 15 µm or less. The third width and the fourth width are each 14 µm or less. The fifth width and the sixth width are each 20 µm or more. The first conductor circuit has a substantially rectangular cross-sectional shape. The second conductor circuit has a substantially trapezoidal cross-sectional shape.

A printed wiring board according to an embodiment of the present invention includes the second conductor circuit and the conductor circuits (the fifth conductor circuit and the sixth conductor circuit) positioned on both sides of the second conductor circuit. For example, the second conductor circuit has a width of 15 µm or less. The fifth space between the second conductor circuit and the fifth conductor circuit is filled with the second resin insulating layer. The sixth space between the second conductor circuit and the sixth conductor circuit is filled with the second resin insulating layer. The fifth space has a width of 20 µm or more. The sixth space has a width of 20 µm or more. When the printed wiring board is subjected to heat cycles, the resin insulating layer filling the spaces repeats expansion and contraction. When the resin insulating layer expands, it is thought that the resin insulating layer presses the conductor circuit. When the resin insulating layer contracts, it is thought that the resin insulating layer pulls the conductor circuit. When the widths of spaces are large, it is thought that a force pressing the conductor circuit is larger. It is thought that a force pulling the conductor circuit is large. Since the width of the fifth space and the width of the sixth space are each 20 µm or more, it is thought that the force pressing the second conductor circuit is large. It is thought that the force pulling the second conductor circuit is large. The smaller the width of the conductor circuit is, the more difficult it is for the conductor circuit to withstand those forces. When the width of the second conductor circuit is 15 µm or less, the second conductor circuit is likely to collapse due to the pressing. The second conductor circuit is likely to collapse due to the pulling. However, the second conductor circuit has a trapezoidal cross-sectional shape. It is thought that the force pressing the second conductor circuit is dispersed along the side walls. It is thought that the force pulling the second conductor circuit is dispersed along the side walls. Therefore, even when the width of the second conductor circuit is 15 µm or less and the widths of the fifth space and the sixth space are each 20 µm or more, the second conductor circuit is unlikely to collapse.

A printed wiring board according to an embodiment of the present invention includes the first conductor circuit and the conductor circuits (the third conductor circuit and the fourth conductor circuit) positioned on both sides of the first conductor circuit. The first conductor circuit has a width of 15 µm or less. The third space between the first conductor circuit and the third conductor circuit is filled with the second resin insulating layer. The fourth space between the first conductor circuit and the fourth conductor circuit is filled with the second resin insulating layer. The third space has a width of 14 µm or less. The fourth space has a width of 14 µm or less. When the printed wiring board is subjected to heat cycles, the resin insulating layer filling the spaces repeats expansion and contraction. When the resin insulating layer expands, it is thought that the resin insulating layer presses the conductor circuit. When the resin insulating layer contracts, it is thought that the resin insulating layer pulls the conductor circuit. The third space and the fourth space each have a width of 14 µm or less. Even when the printed wiring board is subjected to heat cycles, it is thought that a force pressing the first conductor circuit is weak. It is thought that a force pulling the first conductor circuit is weak. Therefore, even when the first conductor circuit has a substantially rectangular cross-sectional shape, the first conductor circuit is unlikely to collapse. When the cross-sectional shape of the first conductor circuit is rectangular, a volume of a conductor forming the first conductor circuit can be increased. A resistance of the first conductor circuit can be reduced.

Obviously, numerous modifications and variations of the present invention are possible in light of the above teachings. It is therefore to be understood that within the scope of the appended claims, the invention may be practiced otherwise than as specifically described herein.

What is claimed is:
1. A printed wiring board, comprising:
a first resin insulating layer;
a conductor layer formed on a surface of the first resin insulating layer; and
a second resin insulating layer formed on the surface of the first resin insulating layer such that the second resin insulating layer is covering the conductor layer, wherein the conductor layer includes a first conductor circuit having a first width of 15 μm or less and a substantially rectangular cross-sectional shape, a second conductor circuit having a second width and a substantially trapezoidal cross-sectional shape, a third conductor circuit positioned on a first side of the first conductor circuit, a fourth conductor circuit positioned on a second side of the first conductor circuit on an opposite side with respect to the first side, a fifth conductor circuit positioned on a first side of the second conductor circuit, and a sixth conductor circuit positioned on a second side of the second conductor circuit on an opposite side with respect to the first side of the second conductor circuit, the first and third conductor circuits are positioned to have a third space formed between the first and third conductor circuits such that the third space has a third width of 14 μm or less, the first and fourth conductor circuits are positioned to have a fourth space formed between the first and fourth conductor circuits such that the fourth space has a fourth width of 14 μm or less, the second and fifth conductor circuits are positioned to have a fifth space formed between the second and fifth conductor circuits such that the fifth space has a fifth width of 20 μm or more, and the second and sixth conductor circuits are positioned to have a sixth space formed between the second and sixth conductor circuits such that the sixth space has a sixth width of 20 μm or more.

2. The printed wiring board according to claim 1, wherein the first conductor circuit has a first lower surface in contact with the surface of the first resin insulating layer, a first upper surface on an opposite side with respect to the first lower surface, a third side wall facing the third conductor circuit and having an upper side third side wall extending from the first upper surface and a lower side third side wall extending from the first lower surface, and a fourth side wall facing the fourth conductor circuit and having an upper side fourth side wall extending from the first upper surface and a lower side fourth side wall extending from the first lower surface, the second conductor circuit has a second lower surface in contact with the surface of the first resin insulating layer, a second upper surface on an opposite side with respect to the second lower surface, a fifth side wall facing the fifth conductor circuit, and a sixth side wall facing the sixth conductor circuit, and each of the first upper surface, the second upper surface, the fifth side wall, and the sixth side wall has a rough surface.

3. The printed wiring board according to claim 1, wherein the first conductor circuit has a first lower surface in contact with the surface of the first resin insulating layer, a first upper surface on an opposite side with respect to the first lower surface, a third side wall facing the third conductor circuit and having an upper side third side wall extending from the first upper surface and a lower side third side wall extending from the first lower surface, and a fourth side wall facing the fourth conductor circuit and having an upper side fourth side wall extending from the first upper surface and a lower side fourth side wall extending from the first lower surface, the second conductor circuit has a second lower surface in contact with the surface of the first resin insulating layer, a second upper surface on an opposite side with respect to the second lower surface, a fifth side wall facing the fifth conductor circuit, and a sixth side wall facing the sixth conductor circuit, and the first and second conductor circuits are formed such that a third angle formed between the third side wall and the first lower surface is larger than a fifth angle between the fifth side wall and the second lower surface and a sixth angle between the sixth side wall and the second lower surface, and that a fourth angle formed between the fourth side wall and the first lower surface is larger than the fifth angle formed between the fifth side wall and the second lower surface and the sixth angle between the sixth side wall and the second lower surface.

4. The printed wiring board according to claim 2, wherein the second conductor circuit is formed such that the second width is 15 μm or less.

5. The printed wiring board according to claim 2, wherein the first and second conductor circuits are formed such that the first upper surface, the second upper surface, the fifth side wall, and the sixth side wall have the rough surfaces entirely, and that when each of the third width and the fourth width is 10 μm or more, the upper side third side wall and the upper side fourth side wall have the rough surfaces, and the lower side third side wall and the lower side fourth side wall have no rough surface.

6. The printed wiring board according to claim 2, wherein the first and second conductor circuits are formed such that the first upper surface, the second upper surface, the fifth side wall, and the sixth side wall have the rough surfaces entirely, and that when each of the third width and the fourth width is less than 10 μm, the third side wall and the fourth side wall have no rough surface entirely.

7. The printed wiring board according to claim 3, wherein the first and second conductor circuits are formed such that each of differences between the third angle and the fifth angle, between the third angle and the sixth angle, between the fourth angle and the fifth angle and between the fourth angle and the sixth angle is 7 degrees or more.

8. The printed wiring board according to claim 5, wherein the first conductor circuit is formed such that a length of the upper side third side wall is shorter than a length of the lower side third side wall and that a length of the upper side fourth side wall is shorter than a length of the lower side fourth side wall.

9. The printed wiring board according to claim 8, wherein the first conductor circuit is formed such that a ratio of the length of the lower side third side wall to the length of the upper side third side wall is in a range of 1.5 to 2, and that a ratio of the length of the lower side fourth side wall to the length of the upper side fourth side wall is in a range of 1.5 to 2.

10. The printed wiring board according to claim 1, wherein the surface of the first resin insulating layer has unevenness and includes an average line of a roughness curve of the unevenness.

11. The printed wiring board according to claim 10, wherein the first, second, third, fourth, fifth and sixth conductor circuits are formed such that the first width, the second width, the third width, the fourth width, the fifth width, the sixth width, the third angle, the fourth angle, the fifth angle, and the sixth angle are determined from a plane that includes a cross section of the first conductor circuit.

12. The printed wiring board according to claim 11, wherein the first, second, third, fourth, fifth and sixth conductor circuits are formed such that the first width, the second width, the third width, the fourth width, the fifth width, and the sixth width are measured on the average line, that the third angle is an angle between a straight line that includes the average line and a straight line that includes the third side wall, that the fourth angle is an angle between the straight line that includes the average line and a straight line that includes the fourth side wall, that the fifth angle is an angle between the straight line that includes the average line and a straight line that includes the fifth side wall, and that the sixth angle is an angle between the straight line that includes the average line and a straight line that includes the sixth side wall.

13. The printed wiring board according to claim 2, wherein the first and second conductor circuits are formed such that an arithmetic mean roughness Ra of each of the rough surfaces is in a range of 0.5 μm to 2.0 μm.

14. The printed wiring board according to claim 6, wherein the first and second conductor circuits are formed such that an arithmetic mean roughness Ra of each of the rough surfaces is in a range of 0.5 μm to 2.0 μm, that the third side wall is determined to have no rough surface when an arithmetic mean roughness of the third side wall is in a range of 0.01 μm to 0.2 μm, and that the fourth side wall is determined to have no rough surface when an arithmetic mean roughness of the fourth side wall is in a range of 0.01 μm to 0.2 μm.

15. The printed wiring board according to claim 1, wherein the conductor layer has a thickness in a range of 7 μm to 15 μm.

16. The printed wiring board according to claim 1, wherein the second conductor circuit is formed such that the second width is 15 μm or less.

17. The printed wiring board according to claim 15, wherein the second conductor circuit is formed such that the second width is 15 μm or less.

18. The printed wiring board according to claim 13, wherein the conductor layer has a thickness in a range of 7 μm to 15 μm.

19. The printed wiring board according to claim 13, wherein the second conductor circuit is formed such that the second width is 15 μm or less.

20. The printed wiring board according to claim 18, wherein the second conductor circuit is formed such that the second width is 15 μm or less.

* * * * *